United States Patent [19]

Niwa et al.

[11] 4,175,235

[45] Nov. 20, 1979

[54] APPARATUS FOR THE PLASMA TREATMENT OF SEMICONDUCTORS

[75] Inventors: Kazuo Niwa, Yokohama; Masahiro Shibagaki, Hiratsuka; Yasuhiro Horiike, Tokyo, all of Japan

[73] Assignee: Tokyo Shibaura Electric Co., Ltd., Japan

[21] Appl. No.: 828,919

[22] Filed: Aug. 29, 1977

[30] Foreign Application Priority Data

Aug. 31, 1976 [JP] Japan .................................. 51-103238

[51] Int. Cl.² .......................... B28D 5/06; H05H 1/24
[52] U.S. Cl. .................................... 250/542; 156/643; 156/646; 204/192 E; 204/192 EC; 204/298; 250/527; 250/531; 250/542
[58] Field of Search ............... 250/527, 531, 542, 543; 156/643, 646; 313/231.3; 204/192 E, 192 EC, 298; 219/121 P

[56] References Cited

U.S. PATENT DOCUMENTS

| | | | |
|---|---|---|---|
| 3,485,666 | 12/1969 | Sterling et al. | 250/531 |
| 3,501,675 | 3/1970 | Cleaver et al. | 313/231.3 |
| 3,551,312 | 12/1970 | Kahng et al. | 250/531 |
| 4,065,369 | 12/1977 | Ogawa et al. | 250/531 |

Primary Examiner—Benjamin R. Padgett
Assistant Examiner—Deborah L. Kyle
Attorney, Agent, or Firm—Finnegan, Henderson, Farabow & Garrett

[57] ABSTRACT

Apparatus for the plasma treatment of semiconductors comprises a plasma generating section, means for introducing a gas suitable for plasma treatment into the plasma generating section, high-frequency discharging means for activating the gas contained in said plasma generating section, a treatment section for treating semiconductor substrates with the activated gas, evacuation means for exhausting the gas, and discharge starting means positiioned in a region including the plasma generating section and its neighborhood, whereby a discharge can be started quickly and assuredly.

9 Claims, 2 Drawing Figures

APPARATUS FOR THE PLASMA TREATMENT OF SEMICONDUCTORS

BACKGROUND OF THE INVENTION

This invention relates to apparatus for the plasma treatment of semiconductors and, more particularly, to apparatus for the plasma treatment of semiconductors having an improved construction which makes it possible to start a discharge quickly and assuredly.

The fabrication of semiconductor device includes the step of subjecting semiconductor substrates to plasma treatment with the aid of an electric discharge. A conventional apparatus for carrying out such plasma treatment is described below by reference to FIG. 1. The term "semiconductor" as used herein comprehends both semiconductive materials such as silicon and semiconductive compounds such as silicon nitride ($Si_3N_4$) and silicon dioxide ($SiO_2$).

In FIG. 1, a treatment chamber 1 has semiconductor substrates 2 placed therein. Within this treatment chamber 1, semiconductor substrates 2 are subjected to plasma treatment, such as plasma etching, in the gas-phase. The gas fed from an etching gas source 4 is introduced into treatment chamber 1 by way of a conduit 5 interconnecting etching gas source 4 and treatment 1. The etching gas is exhausted from treatment chamber 1 after the etching operation by evacuation means 3. In an intermediate portion of conduit 5 is provided a plamsa generating switch 5a, which penetrates through a part of a waveguide 7 connected to a microwave oscillator 6.

In the operation of the above-described plasma etching apparatus, the power switch is first turned on to actuate microwave oscillator 6. Then, a high-frequency electric field is applied through waveguide 7 to plasma generating section 5a, whereby a plasma discharge is started within plasma generating section 5a. It often happens, however, that the application of a high-frequency electric field causes a discharge to occur with a time lag of 1 to 10 seconds or even fails to start a discharge. If no discharge occurs upon application of a high-frequency electric field, it is necessary to cut off the high-frequency electric field and then turn on the power switch again.

Thus, the conventional plasma etching apparatus has a great difficulty in automatizing the operation of the apparatus because it is hard to determine whether a discharge has been started or not and it is sometimes required to operate the power switch over again. More specifically, the time switch for setting the desired treating time cannot be actuated before the operator goes to the trouble of confirming, for example, by visual inspection that a discharge has occurred.

SUMMARY OF THE INVENTION

It is an object of this invention to provide a novel apparatus for the plasma treatment of semiconductors in which a discharge can be started quickly and assuredly.

In accordance with this invention, there is provided apparatus for the plasma treatment of semiconductors comprising a plasma generating section, means for introducing a gas suitable for plasma treatment into said plasma generating section, high-frequency discharging means for activating the gas contained in said plasma generating section, a treatment section for treating semiconductor substrates with the activated gas, evacuation means for exhausting the gas, and discharge starting means positioned in a region including said plasma generating section and its neighborhood.

DETAILED DESCRIPTION OF THE PREFERRED EMBODIMENTS

The plasma treatment apparatus of this invention is characterized by the discharge starting means positioned in such a region of a conventional plasma treatment apparatus as includes the plasma generating section and its neighborhood.

Examples of the discharge starting means includes an electric spark generating means, a radiation applying means, a means for emitting convergent rays of intense light such as a laser flash, and a high-frequency power applying means. Among others, an electric spark generating means is preferred in the practice of this invention. It is also preferable to use an electric spark generating means in combination with any other of the above-described means. For the purpose of this invention, a means generating electric sparks as small as those of an electronic lighter may be used satisfactorily.

Now, a gas-phase plasma etching apparatus in accordance with one embodiment of this invention is described below by reference to FIG. 2. In the followng description, a gaseous mixture of Freon 14 ($CF_4$) and oxygen ($O_2$) is used as the etching gas and a 2.45 GHz microwave is used as the high-frequency discharging means.

Figure 1:
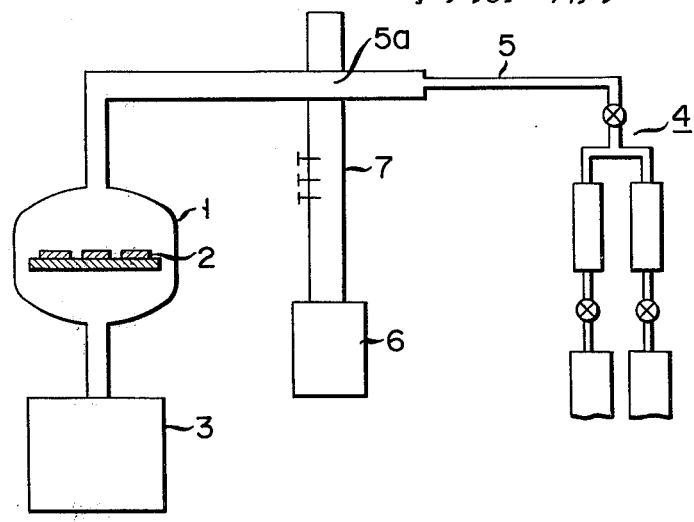
FIG. 1 is a diagrammatic representation of a conventional gas-phase plasma etching apparatus.
Figure 2:
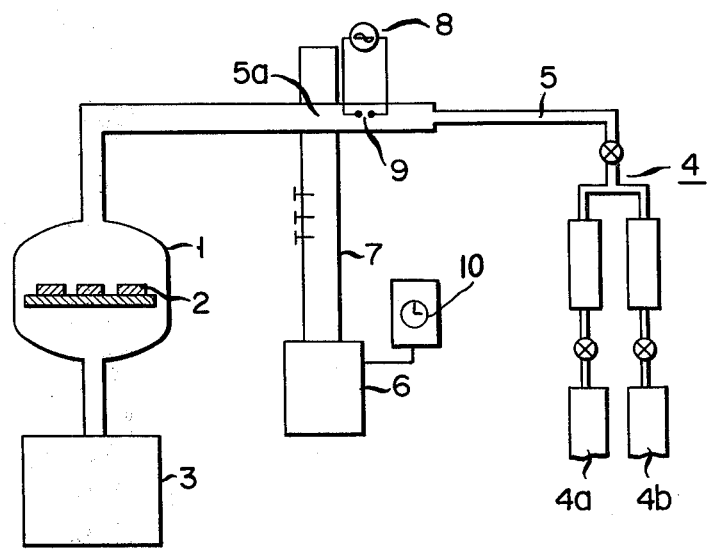
FIG. 2 is a diagrammatic representation of a gas-phase plasma etching apparatus in accordance with one embodiment of this invention.

The apparatus of FIG. 2 is the same as the apparatus of FIG. 1 except that a spark gap 9 connected to a high-voltage power source 8 is provided in a position adjacent to plasma generating section 5a. Etching gas source 4 comprises a source 4a of Freon 14 and a source 4b of oxygen, both of which are so arranged that the respective gases are fed at a predetermined ratio of flow rates.

In the operation of this apparatus, a gaseous mixture of Freon 14 and oxygen having the predetermined ratio of flow rates is first fed from etching gas source 4 through conduit 5 to plasma generating section 5a. Thereafter, microwave oscillator 6 is actuated to apply a high-frequency electric field having a frequency of 2.45 GHz through waveguide 7 to plasma generating section 5a, while at the same time, high-voltage power source 8 is turned on to energize spark gap 9 and thereby generate electric sparks for a period of about 1 second. Consequently, at about the same time as the inhibition of the microwave oscillation, a plasma discharge is started without fail.

In the apparatus of FIG. 2, spark gap 9 is positioned within that portion of conduit 5 which is adjacent to plasma generating section 5a. However, spark gap 9 may be positioned in the atmosphere outside of conduit 5 so long as it is in the neighborhood of plasma generating section 5a.

The operation of the discharge starting means, such as the generation of electric sparks, may be effected at the same time as the application of a high-frequency electric field. Alternatively, it may be initiated prior to the application of a high-frequency electric field and continued until the application thereof.

The reason why, as a result of the operation of the discharge starting means, a discharge is started in the plasma generating section at about the same time as the application of a high-frequency electric field is considered to be as follows: Generally, gas molecules which are electrically neutral undergo no influence of the electric field. However, if ions are present even in very small amounts, the electric field causes those ions to collide with gas molecules and produce additional ions in sequence, resulting in the occurrence of a discharge. Thus, for the purpose of starting a discharge with ease, it is only necessary to supply energy to gas molecules with the aid of electric sparks or the like and thereby produce a very small amount of ions at the initial stage of operation. Then, in the resulting gas atmosphere containing a very small amount of ions, a discharge is started at about the same time as the application of a high-frequency electric field.

As described above, the apparatus for the plasma treatment of semiconductors in accordance with this invention, which is characterized by the discharge starting means positioned in a region including the plasma generating section and its neighborhood, makes it possible to start a discharge assuredly at about the same time as the initiation of high-frequency oscillation. This contrasts with the conventional apparatus in which a plasma discharge occurs with a time lag of 1 to 10 seconds after the initiation of high-frequency oscillation. With the apparatus of this invention, therefore, the treatment, such as etching, of semiconductor substrates can be carried out with high accuracy. In addition, since the semiconductor treating time, such as the etching time, of the apparatus of this invention is equal to the time during which high-frequency oscillation is maintained, automatic etching can be carried out by incorporating a time switch 10, as shown in FIG. 2, in the apparatus of this invention.

Furthermore, the apparatus of this invention having discharge starting means can make the discharging conditions less severe. For example, in the conventional gas-phase plasma etching apparatus having no discharge starting means, a discharge is started by means of microwaves whose power is 100 W or more and preferably 150 to 500 W, even at a gas pressure of the order of $10^{-1}$ Torr. (Microwaves whose power is less than 100 W fail to start a discharge). In the apparatus of this invention, 10 W microwaves are sufficient to start a discharge, even at a gas pressure as high as 10 Torr. At the gas pressure of 10 Torr, no discharge can occur in the conventional apparatus.

As described specifically in connection with the preferred embodiment, the apparatus for the plasma treatment of semiconductors in accordance with this invention is advantageously utilized as a gas-phase plasma etching apparatus in which the etching gas comprises a gaseous mixture of Freon and oxygen. In this case, the gaseous mixture of Freon and oxygen is activated by means of a microwave to produce long-life etching species including COF radicals, which in turn serve to etch the semiconductor substrates.

The principle of this invention is not only applicable to etching apparatus, but also to vapor deposition apparatus and the like.

What we claim is:

1. Apparatus for the plasma etching of semiconductors comprising a plasma-generating section, means for introducing a gas suitable for plasma etching into said plasma-generating section, microwave discharging means for activating the gas contained in said plasma-generating section, an etching section in fluid communication with, and apart from, said plasma-generating section for etching semiconductor substrates with the activated gas, evacuation means for exhausting the gas from said etching section, and electric spark generating means positioned upstream of said plasma-generating section.

2. Apparatus as claimed in claim 1 wherein said microwave discharging means comprises a microwave oscillator and a waveguide connected thereto.

3. Apparatus as claimed in claim 2 also including a conduit penetrating through a portion of said waveguide and wherein said plasma-generating section is located within said conduit.

4. Apparatus as claimed in claim 3 also including a time switch on the microwave discharging means for automatically controlling the etching time of the apparatus.

5. Apparatus for plasma etching of semiconductors comprising a plasma-generating section; means for introducing a gas suitable for plasma etching into said plasma-generating section; high-frequency discharging means for activating the gas contained in said plasma-generating section; an etching section in fluid communication with, and apart from, said plasma-generating section for etching semiconductor substrates with the activated gas, evacuation means for exhausting the gas from said etching section, and auxiliary means for creating ions in said gas in said plasma-generating section.

6. The apparatus of claim 5 wherein said auxiliary means is located upstream of said plasma-generating section.

7. The apparatus of claim 6 wherein said auxiliary means includes electric spark generating means.

8. The apparatus of claim 7 wherein said high-frequency discharging means includes a microwave oscillator.

9. The apparatus of claim 8 wherein said microwave oscillator supplies a minimum power of 10 W.

* * * * *